METHOD FOR MAKING A MEMORY PLANE
Filed Oct. 1, 1965
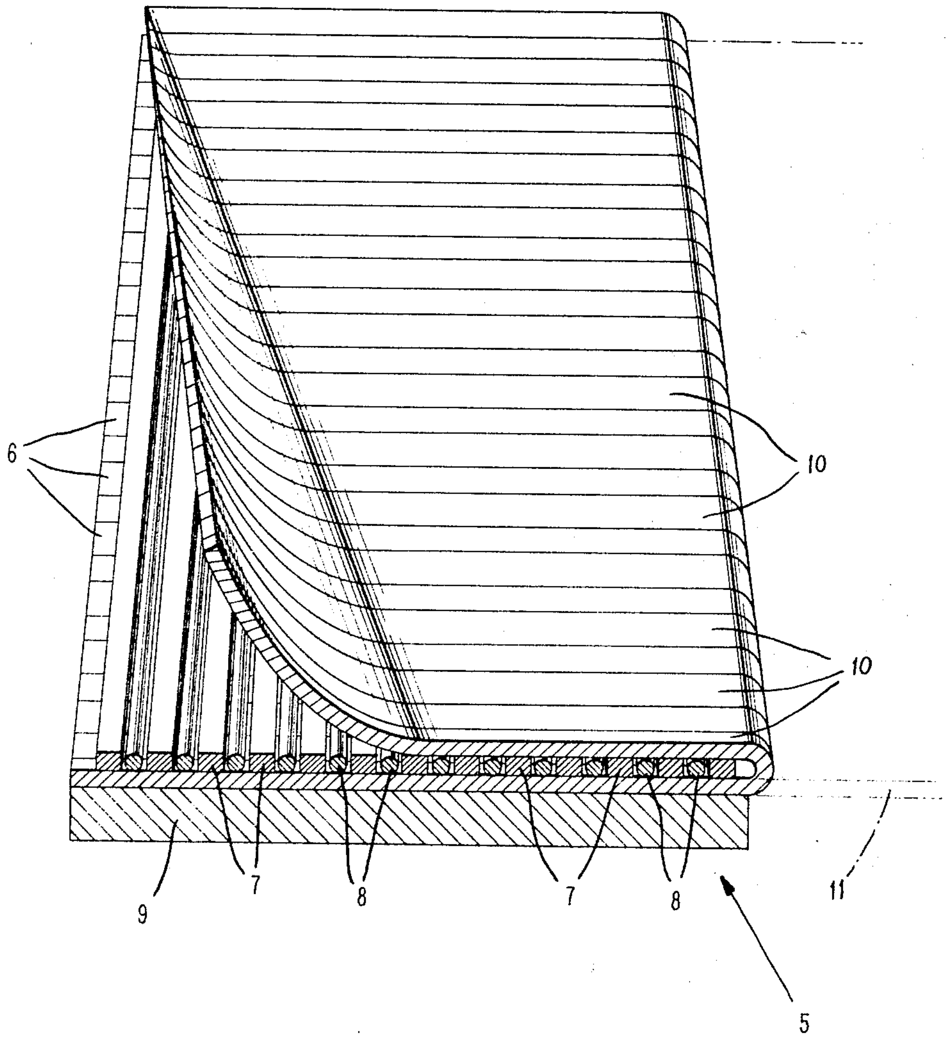
INVENTORS
GILBERT R. REID
ARTHUR P. SCHULTZ
BY Rene A. Kuypers
ATTORNEY

United States Patent Office 3,448,514
Patented June 10, 1969

3,448,514

METHOD FOR MAKING A MEMORY PLANE

Gilbert R. Reid, Norristown, Pa., and Arthur P. Schultz, Cherry Hill, N.J., assignors to Sperry Rand Corporation, New York, N.Y., a corporation of Delaware Filed Oct. 1, 1965, Ser. No. 492,189
Int. Cl. H01f *7/06;* B41m *3/08;* H05k *3/20*
U.S. Cl. 29—604 10 Claims

ABSTRACT OF THE DISCLOSURE

This invention relates to a method for fabricating a plated wire memory plane. A word line laminate is positioned over a plurality of plated wires and on top of a plurality of embossed ridges, which define grooves in a formable material, in such a manner that a plurality of metallic word lines are positioned orthogonally to the plated wires. The grooves are formed by using an accurately machined template. An epoxy resin is then spread on one-half of the word line laminate after which the template is pressed to form the required grooves. The memory plane is completed by positioning the remaining half of the word laminate upon the top of the formed ridges.

This invention relates in general to a memory plane and in general relates to a memory plane for use with plated wires.

In present day digital computers, there is a requirement for memory planes that provide a simple arrangement for storing a large number of digital memory elements. Such memory elements are adapted to store either a binary "0" or "1." The memory plane for plated wire memory elements must provide the means for properly positioning and holding the wires which are the size of a human hair and furthermore have the facility to provide dense packing of the wires.

Accordingly, it is an object of this invention to provide a new and improved memory plane;

It is another object of this invention to provide a memory plane that is simply and economically manufactured.

In accordance with a feature of this invention, a simple technique is provided for fabricating a memory plane for use with a plated wire storage element. The plated wire memory plane of the instant invention provides accurately and closely spaced grooves for locating the wires. The memory plane is obtained by placing one-half of a word line laminate (i. e., an insulating substrate upon which are etched a plurality of conductive lines) upon a stiffener. The laminate is permanently placed upon the stiffener so that one-half the length of conductors are fastened upon the stiffener and the remaining length is freely movable. An epoxy resin or other suitable plastic is then placed upon the laminate which is fastened to the stiffener. The epoxy resin is then embossed with an accurately machined template thereby forming grooves to receive the plated wires. The portion of the word line laminate that is not fastened to the stiffener is then folded back over the ridges defined by the grooves and bonded in place.

The novel features that are considered characteristic of this invention are set forth with particularity in the appended claims. The invention itself, however, both as to its organization and method of operation, as well as additional objects and advantages thereof will best be understood from the following description when considered in conjunction with the accompanying drawings wherein:

The accompanying drawing depicts the memory plane arrangement of the plated wires, which are positioned in grooves, in conjunction with the orthogonally oriented word straps.

Referring now to the accompanying figure, the memory plane 5 is shown for use with plated wire storage elements 8. The plated wires 8 are conventionally a 5 mil diameter beryllium copper substrate upon which is electroplated a thin magnetic film with a thickness on the order of 10,000 angstroms. The magnetic film is a Permalloy composition having the approximate proportions of 80% nickel and 20% iron. The film is continuous and is plated in the presence of a circumferential magnetic field that establishes a magnetic antisotropy axis, or preferred magnetization direction circumferentially around the wire. The wires are coated with polyurethane (not shown) for insulating purposes. The word line laminate 6 is fabricated by etching a plurality of conductive lines 10 upon an insulating, pliable substrate 11 such as Mylar, glass epoxy or H-film (polyimide resin). The conductive lines 10 are typically twenty mil wide copper lines.

One-half of the word line laminate 6 is permanently positioned upon stiffener 9 with an adhesive so that the conductive lines are facing in an upward direction and the plastic substrate 11 is juxtaposed to the stiffener 9. The conductive lines 10 are thus oriented very close to the plated wires 8 so that an intense magnetic field is developed thereat.

An epoxy resin or other suitable material is then placed on the plastic substrate 11 in the area of the stiffener 9. The epoxy resin is applied to the plastic substrate 11 in liquid form but with a consistency to prevent running. The epoxy resin is then embossed with an accurately machined template thereby forming the embossed ridges 7. Two adjacent ridges define a groove which is adapted to receive a plated wire. The grooves are only slightly larger than the 5 mil diameter plated wires 8 and in a particular embodiment are approximately 7 mils wide and 7 mils high. The reason that the grooves are made slightly larger than the plated wires 8 is for easy insertion and removal. Thus, after a memory plane 5 has been fabricated, it is sometimes found that a bad spot is present on a plated wire 8 necessitating simple removal and replacement. This is an important feature particularly in a large scale memory wherein there may be thousands of plated wires. The epoxy resin which has been formed into the grooves is cured and hardened.

After the grooves have been formed and hardened, the word line laminate 6 is prepared to be folded back on top of the ridges. An adhesive, such as epoxy resin, is first coated upon the inside layer of the word line laminate 6 at a thickness of approximately one-half mil. The word line laminate 6 is then folded back and rested upon the top of the embossed ridges 7. The layer of epoxy resin adhesive applied to the inside of the word line laminate 6 is thinly applied so that is does not seep into the grooves and hence, does not block the ingress or egress of plated wires 8.

In accordance with the plated wire memory art, the conductive lines formed on the word line laminate in conjunction with the plate wires it is juxtaposed to comprise a computer memory word. In other words, each memory word consists of a plurality of bits (i.e., a binary "0" or "1") each bit being formed by the intersection of a conductive line and a plated wire.

In summary, this invention relates to a simplified technique for fabricating a memory plane for use with plated wire memories. The method comprises placing one-half of a word line laminate upon whose surface are etched a plurality of parallel, metallic conductors on a stiffener. An epoxy resin is then spread on the half of word line laminate which is upon the stiffener. A master template, which has accurately machined grooves in accordance with the desired packing density of the wires (e.g. 66 grooves to the inch), is then pressed upon the epoxy resin thereby forming embossed ridges. Adjacent ridges define grooves with a width which is adapted to received a plated wire. The memory plane is completed by positioning the remaining half of the word laminate upon the top of the formed ridges.

Obviously, many modifications and variations of the present invention are possible in the light of the above teaching. It is therefore to be understood that in the scope of the appended claims, the invention may be practiced otherwise than as specifically described.

The embodiments of the invention in which an exclusive property or privilege is claimed are defined as follows:

1. The method of making a memory plane comprising the steps of:
- (a) locating one-half of a flexible word line laminate on a substantially non-pliable substrate;
- (b) depositing a formable material on said one-half of said laminate;
- (c) forming said material into a plurality of grooves;
- (d) folding the remaining one-half of said word line laminate on top of the ridges of said grooves;
- (e) inserting a plated magnetizable wire into each said grooves formed by two adjacent ridges.

2. The method of making a memory plane comprising the steps of:
- (a) attaching one-half of a flexible word line laminate on a substantially non-pliable substrate, said word line laminate comprising a plurality of conductive lines formed upon an insulating surface, said insulating surface being located face down on said non-pliable substrate;
- (b) depositing a formable material on said one-half of said conductive lines positioned upon said non-pliable substrate;
- (c) forming said material into a plurality of grooves;
- (d) folding the remaining one-half of said word line laminate on top of the ridges of said grooves;
- (e) inserting a Permalloy plated magnetizable wire into each said grooves formed by two adjacent ridges.

3. The method of making a memory plane comprising the steps of:
- (a) attaching one-half of a flexible word line laminate on a substantially non-pliable substrate, said word line laminate comprising a plurality of conductive lines formed upon an insulating surface, said insulating surface being located face down on said non-pliable substrate;

- (b) depositing a formable material on said one-half of said conductive lines positioned upon said non-pliable substrate;
- (c) embossing said material into a plurality of parallel ridges;
- (d) folding the remaining one-half of said word line laminate on top of said ridges;
- (e) inserting a Permalloy plated magnetizable wire into the grooves formed by two adjacent ridges.

4. The method in accordance with claim 3 wherein said formable material is epoxy resin.

5. The method in accordance with claim 3 wherein said embossing is obtained with an accurately machined metal master.

6. The method in accordance with claim 3 wherein said flexible word line laminate comprises copper lines etched upon glass epoxy or polyimide.

7. The method in accordance with claim 3 wherein said plated magnetizable wire has a diameter in the range of 5 mils in diameter.

8. The method in accordance with claim 4 wherein said epoxy resin has a thickness of approximately one-half mil.

9. The method in accordance with claim 3 wherein said plated magnetizable wire comprises a beryllium-copper substrate upon which is coated a Permalloy film comprising 85% nickel and 20% iron.

10. The method in accordance with claim 9 wherein said Permalloy film has a thickness in the range of 10,000 angstroms.

References Cited

UNITED STATES PATENTS

| | | | |
|---|---|---|---|
| 3,084,336 | 4/1963 | Clemons. | |
| 3,266,126 | 8/1966 | Dowling | 29—604 |
| 3,079,672 | 3/1963 | Bain et al. | 29—625 |
| 3,100,295 | 8/1963 | Schweizerhof | 29—604 |
| 3,176,277 | 3/1965 | Weisz et al. | 340—174 |
| 3,210,742 | 10/1965 | Clow | 340—174 |
| 3,317,408 | 5/1967 | Barnes et al. | 340—174 |

JOHN F. CAMPBELL, *Primary Examiner.*

D. C. REILEY, *Assistant Examiner.*

U.S. Cl. X.R.

29—625; 340—174